United States Patent
Wang

(10) Patent No.: US 9,882,133 B2
(45) Date of Patent: Jan. 30, 2018

(54) ELECTRONIC PACKAGE DEVICE FOR TESTING A PACKAGE EFFECT OF THE DEVICE, FABRICATION METHOD THEREOF AND METHOD FOR TESTING ELECTRONIC PACKAGE DEVICE

(71) Applicant: BOE Technology Group Co., Ltd., Beijing (CN)

(72) Inventor: Dan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 7 days.

(21) Appl. No.: 14/646,138

(22) PCT Filed: Oct. 21, 2014

(86) PCT No.: PCT/CN2014/089054
§ 371 (c)(1),
(2) Date: May 20, 2015

(87) PCT Pub. No.: WO2016/026203
PCT Pub. Date: Feb. 25, 2016

(65) Prior Publication Data
US 2016/0056381 A1      Feb. 25, 2016

(30) Foreign Application Priority Data
Aug. 20, 2014   (CN) .......................... 2014 1 0412609

(51) Int. Cl.
*H01L 51/00* (2006.01)
*H01L 51/52* (2006.01)
*H01L 21/66* (2006.01)

(52) U.S. Cl.
CPC ...... *H01L 51/0031* (2013.01); *H01L 51/0024* (2013.01); *H01L 51/5246* (2013.01); *H01L 51/5259* (2013.01); *H01L 22/32* (2013.01)

(58) Field of Classification Search
CPC ............. H01L 51/0031; H01L 51/5246; H01L 51/5259; H01L 51/0024
See application file for complete search history.

(56) References Cited

U.S. PATENT DOCUMENTS 7,373,819 B2      5/2008   Engler et al.
2002/0160291 A1*  10/2002  Yaguchi ............... G03G 9/0819
                                                    430/108.1

FOREIGN PATENT DOCUMENTS

CN      101632010 A    1/2010
CN      102709257 A    10/2012
(Continued)

OTHER PUBLICATIONS

Google translation of CN103247667; 8 pages; translated on Dec. 31, 2016.*
(Continued)

*Primary Examiner* — Kyoung Lee
*Assistant Examiner* — Christina Sylvia
(74) *Attorney, Agent, or Firm* — Banner & Witcoff, Ltd.

(57) ABSTRACT

Embodiments of the disclosure provide an electronic package device and a fabrication method thereof, and a method for testing the electronic package device. The electronic package device comprises a base substrate and a package substrate that are provided opposite to each other, and a sealant provided therebetween. The electronic package device further comprises an electronic function layer provided on a side of the base substrate facing the package substrate, and a laminated film layer and a test lead provided on a side of the package substrate facing the base substrate. The laminated film layer comprises a hygroscopic film adjacent to the package substrate and a piezoelectric film coating surfaces of the hygroscopic film. The piezoelectric film contacts one end of the test lead, and the other end of (Continued)

the test lead passes through the sealant and extends to an exterior of the electronic package device.

16 Claims, 1 Drawing Sheet

(56) References Cited

FOREIGN PATENT DOCUMENTS

| CN | 103217459 A | 7/2013 |
| CN | 103247667 A | 8/2013 |
| JP | H0321849 A | 1/1991 |

OTHER PUBLICATIONS

Jan. 4, 2015—(WO) International Search Report—App PCT/CN2014/089054—Eng Tran.
Mar. 28, 2016—(CN)—First Office Action Appn 201410412609.X with English Tran.
Aug. 10, 2016—(CN) Second Office Action Appn 201410412609.X with English Tran.

* cited by examiner

ELECTRONIC PACKAGE DEVICE FOR TESTING A PACKAGE EFFECT OF THE DEVICE, FABRICATION METHOD THEREOF AND METHOD FOR TESTING ELECTRONIC PACKAGE DEVICE

The application is a U.S. National Phase Entry of International Application No. PCT/CN2014/089054 filed on Oct. 21, 2014, designating the United States of America and claiming priority to Chinese Patent Application No. 201410412609.X filed on Aug. 20, 2014. The present application claims priority to and the benefit of the above-identified applications and the above-identified applications are incorporated by reference herein in their entirety.

TECHNICAL FIELD

Embodiments of the disclosure relate to an electronic package device and a fabrication method thereof, and a method for testing the electronic package device.

BACKGROUND

Many electronic devices are very sensitive to water vapor and oxygen in atmospheric environment, so it is necessary to package the electronic devices to isolate them from external environment. By taking an Organic Light Emitting Diode (OLED) as an example, since an organic material function layer in the OLED is extremely sensitive to water vapor and oxygen, it is necessary to fully isolate the organic material function layer of the OLED from the external environment to make the airtight performance of the OLED meet the requirements (water vapor $10^{-6}$ g/da y/m$^2$, and oxygen $10^{-3}$ cm$^3$/day/m$^2$), thereby ensuring that the performance of the OLED will not be affected by water vapor and oxygen in the external environment.

It can be seen from the above description that in an environment with low water vapor and oxygen concentrations, a method for testing a package effect of the OLED is also very important. The testing methods that are often used currently mainly comprise a metal oxidation method (i.e., a calcium test method) and a hygroscopic expansion method. The metal oxidation method is a method of quantitatively calculating the water vapor and oxygen concentrations by using changes of transmittance and electrical conductivity of calcium metal under certain water vapor and oxygen concentrations; since this method is a chemical method, its test sensitivity is relatively low. The hygroscopic expansion method can be divided into two types: one is to record a change of an expansion area by using hygroscopic expansivity of a hygroscopic film in combination with a way of camera shooting to thereby implement assessment on the water vapor and oxygen concentrations, however, this method cannot calculate the water vapor and oxygen concentrations accurately; the other one is to dope conductive particles in a hygroscopic film, and measure water vapor and oxygen concentrations by measuring a change of electrical conductivity of the hygroscopic film before and after water vapor absorption, however, this method involves doping conductive particles into a polymer material, and stability and electrical conductivity of the material are both limited to a certain extent, which thus may cause the test result to be not accurate enough.

SUMMARY

According to embodiments of the disclosure, an electronic package device is provided. The electronic package device comprises a base substrate and a package substrate that are provided opposite to each other, and a sealant provided between the base substrate and the package substrate. The electronic package device further comprises an electronic function layer provided on a side of the base substrate facing the package substrate, and a laminated film layer and a test lead provided on a side of the package substrate facing the base substrate. The laminated film layer comprises a hygroscopic film adjacent to the package substrate and a piezoelectric film coating surfaces of the hygroscopic film. The piezoelectric film contacts one end of the test lead, and the other end of the test lead passes through the sealant and extends to an exterior of the electronic package device.

For example, the sealant comprises a UV adhesive or a glass glue.

For example, the hygroscopic film comprises a polymer hygroscopic film; and the piezoelectric film comprises a polyvinylidene fluoride film.

For example, the polymer hygroscopic film comprises one or more of a rubber capable of swelling upon absorbing water, a hydrogel material, a poly-epoxy resin, a polyacrylamide material and a polyacrylate material.

For example, the hygroscopic film is disconnected from the test lead.

For example, the electronic package device is an OLED; and the electronic function layer is an organic material function layer of the OLED.

According to the embodiments of the disclosure, a fabrication method of an electronic package device is provided. The method comprises: providing a base substrate, and providing an electronic function layer on the base substrate; providing a package substrate, and forming a laminated film layer and a test lead on the package substrate; forming a sealant on a periphery of the base substrate or the package substrate and bonding the base substrate and the package substrate by curing the sealant. The forming the laminated film layer and the test lead on the package substrate comprises: forming a hygroscopic film and a test lead on the package substrate; and forming a piezoelectric film on the package substrate where the hygroscopic film and the test lead have been formed. The piezoelectric film coats surfaces of the hygroscopic film, the piezoelectric film contacts one end of the test lead, and the other end of the test lead passes through the sealant and extends to an exterior of the electronic package device.

For example, the forming the hygroscopic film and the test lead on the package substrate comprises: forming the hygroscopic film on the package substrate, and then forming the test lead on the package substrate where the hygroscopic film has been formed; or forming the test lead on the package substrate, and then forming the hygroscopic film on the package substrate where the test lead has been formed.

For example, the forming the sealant on the periphery of the base substrate or the package substrate and bonding the base substrate and the package substrate by curing the sealant comprises: forming a UV adhesive or a glass glue on the periphery of the base substrate or the package substrate; aligning the base substrate and the package substrate; curing the UV-curing adhesive or the glass glue to bonding the base substrate and the package substrate.

For example, the hygroscopic film comprises a polymer hygroscopic film; and the piezoelectric film comprises a polyvinylidene fluoride film.

For example, the polymer hygroscopic film comprises one or more of a rubber capable of swelling upon absorbing water, a hydrogel material, a poly-epoxy resin, a polyacrylamide material and a polyacrylate material.

For example, the hygroscopic film is disconnected from the test lead.

For example, the electronic package device is an OLED; and the electronic function layer is an organic material function layer of the OLED.

According to the embodiments of the disclosure, a method for testing the above electronic package device is provided. The method comprises: connecting a test device with the test lead to measure a voltage of the piezoelectric film through the test lead; and comparing the voltage of the piezoelectric film with a standard voltage curve to judge the package effect of the electronic package device. The standard voltage curve is a curve of relationship between the voltage of the piezoelectric film and a volume swell amount of the hygroscopic film.

For example, the comparing the voltage of the piezoelectric film with the standard voltage curve to judge the package effect of the electronic package device comprises: comparing the voltage of the piezoelectric film with the standard voltage curve to obtain the volume swell amount of the hygroscopic film; and judging the package effect of the electronic package device according to the volume swell amount of the hygroscopic film.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not intended to limit the disclosure.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
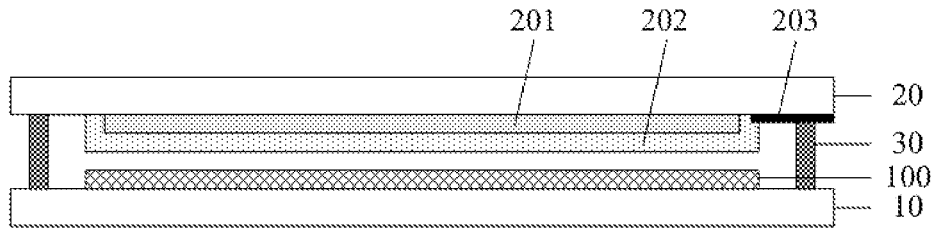
FIG. 1 is a structural schematic view illustrating an electronic package device according to embodiments of the disclosure.

Embodiments of the disclosure provide an electronic package device. As shown in FIG. 1, the electronic package device comprises a base substrate 10 and a package substrate 20 that are provided opposite to each other, and a sealant 30 provided between the base substrate 10 and the package substrate 20. The electronic package device further comprises an electronic function layer 100 provided on a side of the base substrate 10 facing the package substrate 20, and a laminated film layer and a test lead 203 provided on a side of the package substrate 20 facing the base substrate 10. For example, the laminated film layer comprises a hygroscopic film 201 adjacent to the package substrate 20 and a piezoelectric film 202 covering surfaces of the hygroscopic film 201; the piezoelectric film 202 contacts one end of the test lead 203, and the other end of the test lead 203 passes through the sealant 30 and extends to an exterior of the electronic package device.

It should be noted that, the electronic package device mainly refers to a thin-film device that is sensitive to water vapor and oxygen in the atmospheric environment, for example, an optoelectronic device such as an OLED, a solar cell and the like.

It should be noted that, both the base substrate 10 and the package substrate 20 may be flexible substrates or glass substrates. For example, the flexible substrate may be any one of a polyimide substrate, a polyethylene substrate, a polypropylene substrate, a polystyrene substrate, a polyethylene terephthalate substrate, and a polyethylene naphthalate substrate.

It should be noted that, the laminated film layer comprises the hygroscopic film 201 and the piezoelectric film 202; herein, the piezoelectric film 202 coating the surfaces of the hygroscopic film 201 means that a surface on a side of the hygroscopic film 201 away from the package substrate 20 and side surfaces of the hygroscopic film 201 are all coated by the piezoelectric film 202.

It should be noted that, one end of the test lead 203 contacts the piezoelectric film 202, and the other end of the test lead 203 passes through the sealant 30 and extends to the exterior of the electronic package device. In this way, in the case that the package effect of the electronic package device is tested, the electronic package device is connected with an external test device via the test lead 203. For example, the test lead 203 may be, but not limited to, a metal lead, as long as the lead 203 has a good conductivity.

In the electronic package device according to the embodiments of the disclosure, the laminated film layer is provided in the electronic package device and the piezoelectric film 202 coats the surfaces of the hygroscopic film 201. The volume of the hygroscopic film 201 will swell upon absorbing water vapor, thereby a certain force is applied by the swelled hygroscopic film 201 to the piezoelectric film 202 coating the surfaces of the hygroscopic film 201. Then, based on a piezoelectric effect of the piezoelectric film 202, the piezoelectric film 202 will generate a certain voltage under the applied force. The piezoelectric film 202 is connected with the exterior of the electronic package device via the test lead 203. In the case that the package effect of the electronic package device is tested, a test device directly measure the voltage of the piezoelectric film 202 through the test lead 203, thereby obtaining a volume swell amount of the hygroscopic film 201, and further calculating the water vapor actually absorbed by the hygroscopic film 201 so as to judge the package effect of the electronic package device.

In the embodiments of the disclosure, the force is exerted on the piezoelectric film 202 by the volume expansion of the hygroscopic film 201, thereby stimulating the piezoelectric effect of the piezoelectric film 202 and then causing a voltage change of the piezoelectric film 202. In this way, when the package effect of the electronic package device is tested, the water vapor actually absorbed by the hygroscopic film 201 is calculated according to the voltage of the piezoelectric film 202, so the test method not only has a high test sensitivity but also presents a more accurate test result. Based on the above description, it can be seen that the hygroscopic film 201 also acts as a desiccant of the electronic package device, so that a service life of the electronic package device is extended.

During bonding the base substrate 10 and the package substrate 20, the sealant 30 may be a UV adhesive or a glass glue.

The UV adhesive is cheap, and its production process is relatively mature. However, the sealability of the UV adhesive is so limited that it should be used together with a desiccant to ensure the working environment inside the device. The hygroscopic film 201 serves as the desiccant inside the electronic package device; of course, other desiccants may also be provided inside the electronic package device, which will not be specifically defined.

For example, the hygroscopic film 201 comprises a polymer hygroscopic film; and the piezoelectric film 202 comprises a polyvinylidene fluoride film.

For example, the polymer hygroscopic film comprises one or more of a rubber capable of swelling upon absorbing water, a hydrogel material, a poly-epoxy resin, a polyacrylamide material and a polyacrylate material, and organic composites of the above materials. Of course, materials for forming the hygroscopic film 201 are not limited thereto, and any other materials capable of absorbing water and swelling upon absorbing water may be adopted.

Herein, the volume of the hygroscopic film 201 will swell upon absorbing water vapor, thus applying a certain force to the piezoelectric film 202; the piezoelectric film 202 generates the piezoelectric effect under the force to cause the voltage change of the piezoelectric film 202.

Thus, the volume swell amount of the hygroscopic film 201 is obtained by measuring the electrical property of the piezoelectric film 202, and a water vapor transmittance of the electronic package device is further obtained.

For example, the electronic package device is an OLED; and the electronic function layer is an organic material function layer in the OLED.

The OLED mainly comprises the base substrate 10, the package substrate 20, and the organic material function layer provided between the base substrate 10 and the package substrate 20. The organic material function layer is extremely sensitive to water vapor and oxygen, so it is very important for the OLED to isolate the organic material function layer from water vapor and oxygen in the exterior environment by a package structure.

A good water vapor and oxygen isolation effect can be obtained by configuring the structure of the OLED to have the structure of the electronic package device according to the embodiments of the disclosure. In this way, when the package effect of the electronic package device is tested, the water vapor actually absorbed by the hygroscopic film 201 is calculated according to the voltage of the piezoelectric film 202, so the test method not only has a high test sensitivity but also presents a more accurate test result. Meanwhile, the hygroscopic film 201 also acts as the desiccant of the electronic package device, thereby the service life of the electronic package device is extended.

Figure 2:
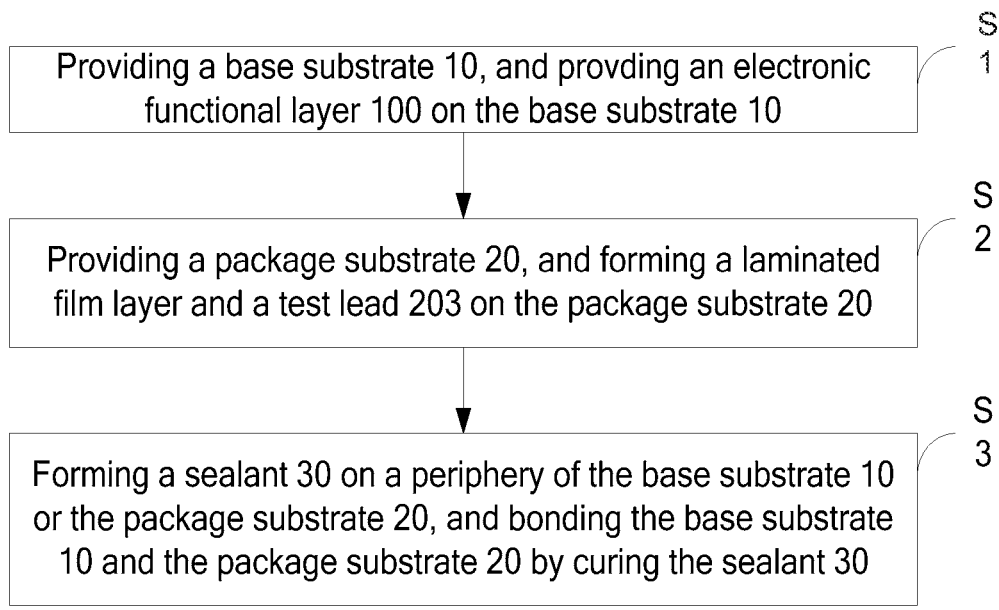
FIG. 2 is a flow chart illustrating a fabrication method of an electronic package device according to embodiments of the disclosure.

Embodiments of the disclosure further provide a fabrication method of an electronic package device. As shown in FIG. 2, the method for example comprises:

S1: providing a base substrate 10, and providing an electronic function layer 100 on the base substrate 10.

For example, the base substrate 10 is a glass substrate.

S2: providing a package substrate 20, and forming a laminated film layer and a test lead 203 on the package substrate 20.

For example, the package substrate 20 is a glass substrate.

S3: forming a sealant 30 on a periphery of the base substrate 10 or the package substrate 20, and bonding the base substrate 10 and the package substrate 20 by curing the sealant 30.

One end of the test lead 203 is provided inside the sealant 30, and the other end of the test lead 203 is provided outside the electronic package device.

The electronic package device according to the embodiments of the disclosure is formed through the above steps S1-S3.

It should be noted that the order of performing steps S1 and S2 is not specifically defined in the embodiments of the disclosure, and it may be determined according to actual production status.

As described above, both the base substrate 10 and the package substrate 20 for example are glass substrates. The glass substrates need to be washed before being used. For example, the glass substrates are washed in a rinse tank with cleaning liquid. Further, the glass substrates for example are washed automatically by an air knife and a brush in the rinse tank. After washed, the glass substrates for example are placed in a dryer and dried, so as to remove the water on the surface of the glass substrates.

For example, the forming the laminated film layer and the test lead 203 on the package substrate 20 comprises:

S201: forming a hygroscopic film 201 and the teat lead 203 on the package substrate 20.

The hygroscopic film 201 and the teat lead 203 do not contact with each other.

The test lead 203 may be a metal lead, and the test lead 203 may comprise a plurality of metal leads.

Herein, the order of forming the hygroscopic film 201 and the teat lead 203 is not specifically defined. The hygroscopic film 201 is firstly formed on the package substrate 20, and then the test lead 203 is formed on the substrate where the hygroscopic film 201 has been formed; or, the test lead 203 is firstly formed on the package substrate 20, and then the hygroscopic film 201 is formed on the substrate where the test lead 203 has been formed.

For example, the hygroscopic film 201 is dried after it is formed.

S202: forming a piezoelectric film 202 on the substrate where the hygroscopic film 201 and the test lead 202 have been formed.

The piezoelectric film 202 coats surfaces of the hygroscopic film 201, and the piezoelectric film 202 contacts one end of the test lead 203.

The laminated film layer and the test lead 203 are formed on the package substrate 20 through the above steps S201-S202.

For example, the hygroscopic film 201 comprises a polymer hygroscopic film; and the piezoelectric film 202 comprises a polyvinylidene fluoride film.

For example, the polymer hygroscopic film comprises one or more of a rubber capable of swelling upon absorbing water, a hydrogel material, a poly-epoxy resin, a polyacrylamide material and a polyacrylate material, and organic composites of the above materials.

On this basis, the forming the laminated film layer may comprise: forming the polymer hygroscopic film on the package substrate 20, and drying the polymer hygroscopic film to completely remove water vapor therein; coating the surfaces of the polymer hygroscopic film with the polyvinylidene fluoride film such that the upper surface and side surfaces of the polymer hygroscopic film are all coated by the polyvinylidene fluoride film, thus ensuring that a total volume change of the polymer hygroscopic film can be measured.

Further, the forming the sealant 30 on the periphery of the base substrate 10 or the package substrate 20 and bonding the base substrate 10 and the package substrate 20 by curing the sealant 30 may comprise:

S301: forming a UV adhesive or a glass glue on the periphery of the base substrate 10 or the package substrate 20.

S302: aligning the base substrate 10 and the package substrate 20.

S303: curing the UV adhesive or the glass glue to bond the base substrate 10 and the package substrate 20.

For example, the UV adhesive may be cured by ultraviolet light, and the glass glue may be cured through laser sintering.

The base substrate 10 and the package substrate 20 are bonded together through the above steps S301-S303.

For example, the electronic package device is an OLED; the electronic function layer 200 is an organic material function layer in the OLED.

Figure 3:
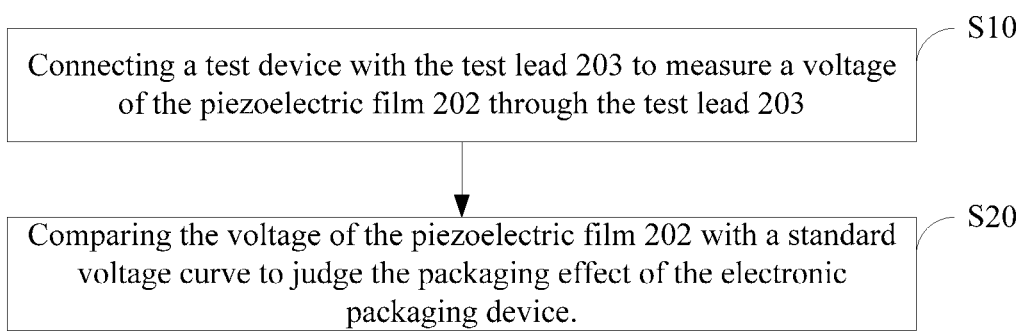
FIG. 3 is a flow chart illustrating a method for testing an electronic package device according to embodiments of the disclosure.

Embodiments of the disclosure further provide a method for testing the above electronic package device. For example, the method tests the packaging effect of the above electronic package device. As shown in FIG. 3, the method for example comprises:

S10: connecting a test device with the test lead 203 to measure a voltage of the piezoelectric film 202 through the test lead 203.

S20: comparing the voltage of the piezoelectric film 202 with a standard voltage curve to judge the package effect of the electronic package device.

The standard voltage curve is a curve of relationship between the voltage of the piezoelectric film 202 and the volume swell amount of the hygroscopic film 201. The standard voltage curve may be obtained through a pretest, and then used directly in the Step S20.

For example, the comparing the voltage of the piezoelectric film 202 with the standard voltage curve to judge the package effect of the electronic package device may comprise: comparing the voltage of the piezoelectric film 202 with the standard voltage curve to obtain the volume swell amount of the hygroscopic film 201; and judging the package effect of the electronic package device according to the volume swell amount of the hygroscopic film 201.

In the case that the package effect of the electronic package device is tested through the above steps S10-S20, the test method not only has a high test sensitivity but also presents a more accurate test result.

The foregoing embodiments merely are exemplary embodiments of the invention, and not intended to define the scope of the invention, and the scope of the invention is determined by the appended claims.

The present application claims priority of Chinese Patent Application No. 201410412609.X filed on Aug. 20, 2014, the disclosure of which is incorporated herein by reference in its entirety as part of the present application.

What is claimed is:

1. An electronic package device, comprising a base substrate and a package substrate that are provided opposite to each other, and a sealant provided between the base substrate and the package substrate; wherein, the electronic package device further comprises an electronic function layer provided on a side of the base substrate facing the package substrate, and a laminated film layer and a test lead provided on a side of the package substrate facing the base substrate;

the laminated film layer comprises a hygroscopic film adjacent to the package substrate and a piezoelectric film coating surfaces of the hygroscopic film;

the piezoelectric film contacts one end of the test lead, and the other end of the test lead passes through the sealant and extends to an exterior of the electronic package device; and the hygroscopic film is disconnected from the test lead.

2. The electronic package device according to claim 1, wherein, the sealant comprises a UV adhesive or a glass glue.

3. The electronic package device according to claim 1, wherein, the hygroscopic film comprises a polymer hygroscopic film; and the piezoelectric film comprises a polyvinylidene fluoride film.

4. The electronic package device according to claim 3, wherein, the polymer hygroscopic film comprises one or more of a rubber capable of swelling upon absorbing water, a hydrogel material, a poly-epoxy resin, a polyacrylamide material and a polyacrylate material.

5. The electronic package device according to claim 1, wherein, the electronic package device is an OLED; and the electronic function layer is an organic material function layer of the OLED.

6. The electronic package device according to claim 1, wherein, a surface on a side of the hygroscopic film away from the package substrate and side surfaces of the hygroscopic film are all coated by the piezoelectric film.

7. A fabrication method of an electronic package device, comprising:

providing a base substrate, and providing an electronic function layer on the base substrate;

providing a package substrate, and forming a laminated film layer and a test lead on the package substrate;

forming a sealant on a periphery of the base substrate or the package substrate and bonding the base substrate and the package substrate by curing the sealant;

wherein, the forming the laminated film layer and the test lead on the package substrate comprises: forming a hygroscopic film and a test lead on the package substrate; and forming a piezoelectric film on the package substrate where the hygroscopic film and the test lead have been formed;

wherein, the piezoelectric film coats surfaces of the hygroscopic film, the piezoelectric film contacts one end of the test lead, and the other end of the test lead passes through the sealant and extends to an exterior of the electronic package device.

8. The method according to claim 7, wherein the forming the hygroscopic film and the test lead on the package substrate comprises:

forming the hygroscopic film on the package substrate, and then forming the test lead on the package substrate where the hygroscopic film has been formed; or forming the test lead on the package substrate, and then forming the hygroscopic film on the package substrate where the test lead has been formed.

9. The method according to claim 7, wherein the forming the sealant on the periphery of the base substrate or the package substrate and bonding the base substrate and the package substrate by curing the sealant comprises:

forming a UV adhesive or a glass glue on the periphery of the base substrate or the package substrate;
aligning the base substrate and the package substrate; and
curing the UV adhesive or the glass glue to bond the base substrate and the package substrate.

10. The method according to claim 7, wherein,
the hygroscopic film comprises a polymer hygroscopic film; and
the piezoelectric film comprises a polyvinylidene fluoride film.

11. The method according to claim 10, wherein, the polymer hygroscopic film comprises one or more of a rubber capable of swelling upon absorbing water, a hydrogel material, a poly-epoxy resin, a polyacrylamide material and a polyacrylate material.

12. The method according to claim 7, wherein the hygroscopic film is disconnected from the test lead.

13. The method according to claim 7, wherein,
the electronic package device is an OLED; and
the electronic function layer is an organic material function layer of the OLED.

14. The method according to claim 7, wherein, a surface on a side of the hygroscopic film away from the package substrate and side surfaces of the hygroscopic film are all coated by the piezoelectric film.

15. A method for testing an electronic package device wherein the electronic package device comprises a base substrate and a package substrate that are provided opposite to each other, and a sealant provided between the base substrate and the package substrate; the electronic package device further comprises an electronic function layer provided on a side of the base substrate facing the package substrate, and a laminated film layer and a test lead provided on a side of the package substrate facing the base substrate; the laminated film layer comprises a hygroscopic film adjacent to the package substrate and a piezoelectric film coating surfaces of the hygroscopic film; and the piezoelectric film contacts one end of the test lead, and the other end of the test lead passes through the sealant and extends to an exterior of the electronic package device,
wherein the method comprises:
connecting a test device with the test lead to measure a voltage of the piezoelectric film through the test lead; and
comparing the voltage of the piezoelectric film with a standard voltage curve to judge a package effect of the electronic package device, and
wherein the standard voltage curve is a curve of relationship between the voltage of the piezoelectric film and a volume swell amount of the hygroscopic film.

16. The method according to claim 15, wherein, the comparing the voltage of the piezoelectric film with the standard voltage curve to judge the package effect of the electronic package device comprises:
comparing the voltage of the piezoelectric film with the standard voltage curve to obtain the volume swell amount of the hygroscopic film; and
judging the package effect of the electronic package device according to the volume swell amount of the hygroscopic film.

* * * * *